(12) United States Patent
Stellberger (10) Patent No.: US 7,030,591 B2
(45) Date of Patent: Apr. 18, 2006

(54) INTEGRATED CIRCUIT IMPLEMENTING PROTECTION SWITCH FOR BATTERY CHARGING AND DISCHARGING WITH ENHANCED REVERSE VOLTAGE PROTECTION

(75) Inventor: Achim Stellberger, Kronau (DE)

(73) Assignee: Dialog Semiconductor GmbH, Kirchheim/Teck-Nabern (DE)

( * ) Notice: Subject to any disclaimer, the term of this patent is extended or adjusted under 35 U.S.C. 154(b) by 231 days.

(21) Appl. No.: 10/627,797

(22) Filed: Jul. 25, 2003

(65) Prior Publication Data
US 2005/0017688 A1  Jan. 27, 2005

(30) Foreign Application Priority Data
Jul. 16, 2003  (EP) .................................. 03368070

(51) Int. Cl.
H01M 10/44 (2006.01)
H01M 10/46 (2006.01)
(52) U.S. Cl. ........................................ 320/134; 320/136
(58) Field of Classification Search ................ 320/132, 320/134, 136
See application file for complete search history.

(56) References Cited
U.S. PATENT DOCUMENTS
5,789,900 A * 8/1998 Hasegawa et al. .......... 320/132

| 5,877,534 A | 3/1999 | Williams et al. ............ 257/355 |
| 5,883,495 A | 3/1999 | Smith et al. ................. 320/128 |
| 5,939,908 A | 8/1999 | Moore et al. ................ 327/108 |
| 6,154,081 A | 11/2000 | Pakkala et al. ............. 327/309 |
| 6,259,306 B1 | 7/2001 | Brulhart et al. ............. 327/436 |

FOREIGN PATENT DOCUMENTS
EP  0720270 A2  7/1996
EP  1047174 A1  10/2000

* cited by examiner

*Primary Examiner*—Edward H. Tso
(74) *Attorney, Agent, or Firm*—George D. Saile; Stephen B. Ackerman (57) ABSTRACT

A battery charging, discharging, and protection switch circuit with enhanced reverse voltage protection is achieved. The circuit comprises, first, field effect transistor (FET) switches having gate, source, drain, and bulk. The FET switches may comprise either NMOS devices or PMOS devices. Second, means of controlling the FET switch's gate and bulk are included. The FET switch gate voltage determines the OFF and ON state of said FET switches. The bulk is switchable coupled between the battery terminal and the load terminal. To achieve high voltage breakdown limits the FET switch is realized with cascaded MOSFETs, where as a novelty here under certain operating conditions, i.e. the battery charger coupled in reverse condition—one FET is working as a source follower. All the necessary MOSFET switches are integrated onto a single chip, together with its controller logic. To form these MOSFETs within a single IC together with the other circuit elements is much less expensive. The circuit of the invention is manufactured with CMOS deep well technology.

35 Claims, 8 Drawing Sheets

FIG. 9A Forward Condition

FIG. 9B Reverse Condition

FIG. 10

INTEGRATED CIRCUIT IMPLEMENTING PROTECTION SWITCH FOR BATTERY CHARGING AND DISCHARGING WITH ENHANCED REVERSE VOLTAGE PROTECTION

RELATED PATENT APPLICATION

This application is related to U.S. patent application Ser. No. 10/017,601, filed on Dec. 14, 2001, and assigned to the same assignee as the present invention. Title: "Power Switch for Battery Protection"

BACKGROUND OF THE INVENTION (1) Field of the Invention

The invention relates generally to electronic circuits for protecting a battery, and more particularly, to a circuit for controlling the charging, discharging, and protection of a rechargeable battery.

2. Description of the Prior Art

Rechargeable batteries are used in a variety of applications, especially for portable electronic devices. In particular, rechargeable batteries are substantial components of portable phones, personal data assistants and digital cameras. Several types of batteries are used in the art, most notably those comprising lithium ion ($Li^+$). For optimum battery life and performance, rechargeable batteries must be protected from excessive charging voltages during recharging and from over discharging while supplying the appliance. The control circuits and switches used for these tasks have to sustain the occuring voltages and currents and also have to operate with an acceptable degree of efficiency. The reliable and cost-effective manufacturing of such circuits, at its best containing all the necessary components within one single integrated circuit is a desirable demand.

Figure 1:
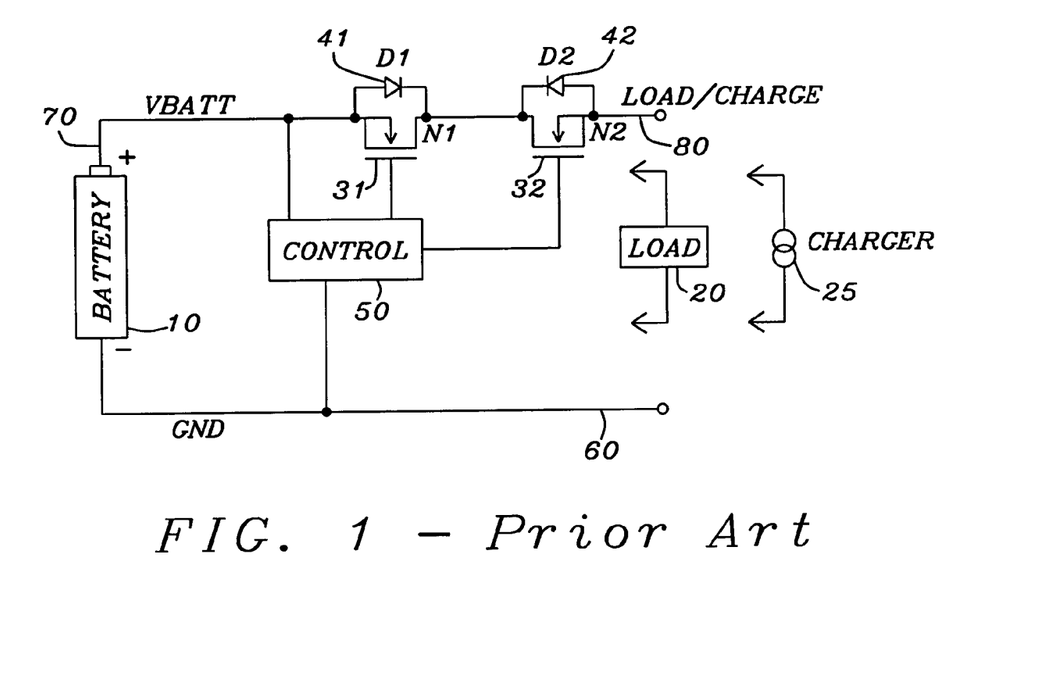
FIG. 1 prior art shows the electrical circuit schematics of a battery charging and discharging protection circuit as realization of the prior art.

Realizations of the prior art for such circuits are often implemented as specifically assembled semiconductor circuit systems, consisting of integrated control circuits combined with separate external switching devices considering the specific voltage and current requirements. FIG. 1 prior art is a commonly used configuration and shown here as an exemplary prior art and showcase battery protection circuit mainly for explanatory purposes. A rechargeable battery 10 is configured such that it can source energy to a load 20 or can be recharged by a charger source 25, both connected to the terminals LOAD/CHARGE 80 and GND 60. Two MOSFET switches N1 31 and N2 32 are used to control the flow of current into (then charging) and out of (then discharging) the battery. The control circuit 50 controls the ON and OFF state of the switches 31 and 32. Typically, the switches comprise discrete devices. Each switch 31 and 32 contains a parasitic bulk-to-drain diode D1 41 and D2 42. By coupling each switch in an opposite manner, each of the parasitic diodes 41 and 42 conducts current in a different direction.

During normal charging or discharging of the battery 10, both of the switches are ON. However, if the control circuit 50 detects an over charging voltage from VBATT 70 to GND 60, then the control circuit turns OFF the switch N1. Since the parasitic diode D1 41 also blocks current flow into the battery, the battery stops charging. In the case of an over discharging condition, the control circuit 50 would detect a too low battery voltage from VBATT 70 to GND 60. The other switch N2 32 would be turned OFF. In this case, the parasitic diode D2 42 blocks current flow out of the battery 10. As typical values for the voltages may be given: 2 . . . 4 V for the rechargeable battery and for the load and 12 V for the charger voltage, with currents up to 500 mA.

Figure 2:
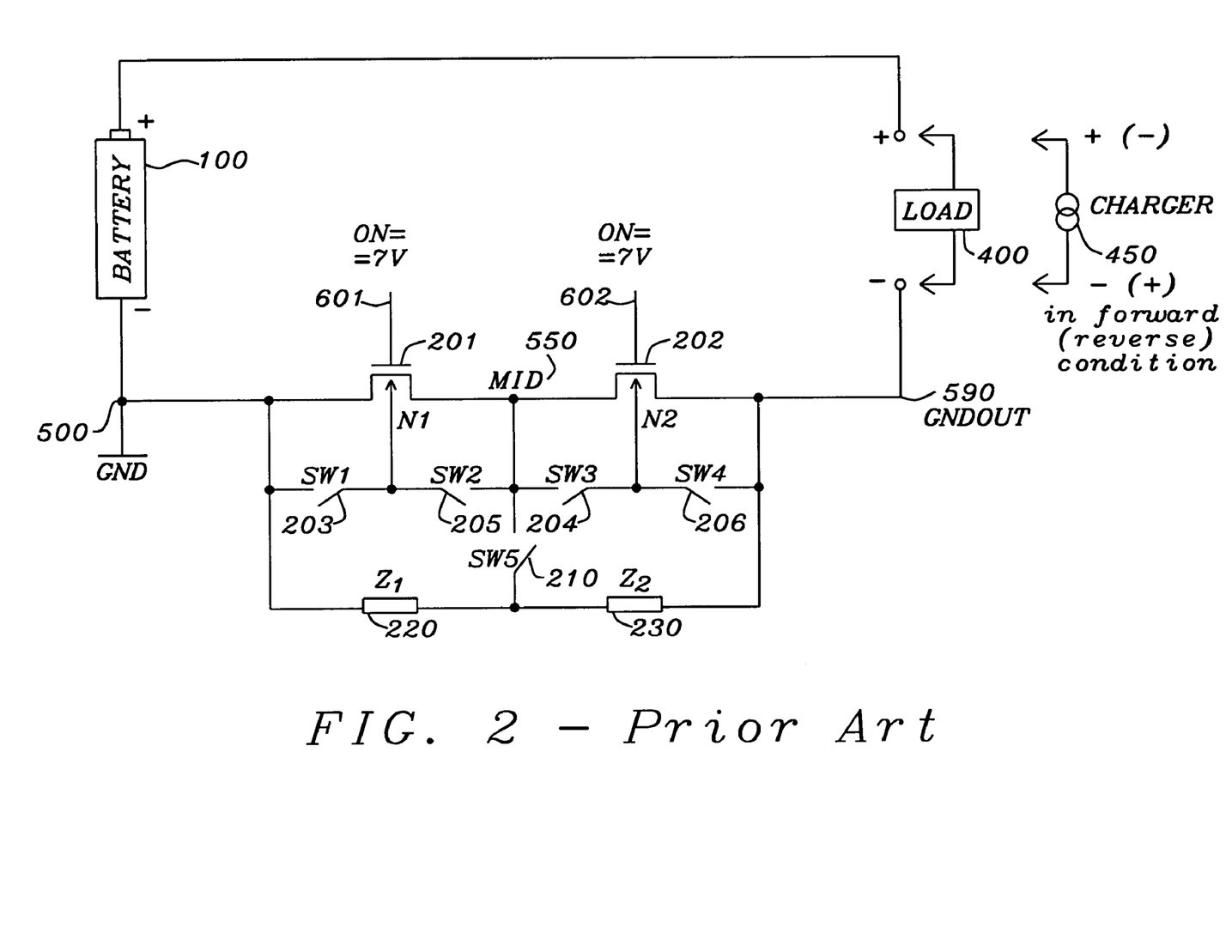
FIG. 2 prior art depicts the detailed electrical circuit diagram of the realization of the protection circuit system in the related patent "Power Switch for Battery Protection", operating with a cascade of MOSFET switches, wherein the circuit is shown as controlled in normal operating mode, for discharging and charging.

Referring now to FIG. 2 prior art, a second realization of such protective circuits is illustrated. In this case, two NMOS FET switches N1 (item 201) and N2 (item 202) are used. N1 and N2 are cascaded to provide a combined switch having a larger operating voltage range than is available with a single switch. This is a configuration as developed for the related patent "Power Switch for Battery Protection" and shown here operating in the normal charging or discharging modes (*) see Table 1). By nature, the battery-charging source (item 450) is capable of generating a larger voltage than the battery (item 100). When an over charge condition is detected, and a single switch solution is turned OFF, the voltage difference between the charger (item 450) and the battery (item 100) must be sustained across that switch. The voltage range of the switches is limited by the drain-to-bulk reverse breakdown as given be the manufacturing process. This breakdown voltage may be about 7 Volts for a single FET, for example. This means that the charger design must be limited to not generate a voltage greater than the battery voltage plus the breakdown voltages of the FETs. The use of the cascaded NMOS FET devices N1 (item 201) and N2 (item 202) increases the operating range of the combined switch in such a way, that a voltage difference of, for example, about 14 Volts can be sustained in the OFF state. The first FET switch N1 has gate, source, drain, and bulk. The drain is coupled to the negative battery terminal, GND (item 500). The bulk is coupled switchable between the negative battery terminal GND and a middle node MID (item 550) between the cascaded FET devices N1 (item 201) and N2 (item 202). The second FET switch N2 (item 202) also has gate, source, drain, and bulk. The drain is coupled to the first FET switch N1 source at the mid node MID (item 550). The source is coupled to the load terminal node GNDOUT (item 590). The bulk of N2 (item 202) is coupled switchable between MID (item 550) and the load terminal GNDOUT (item 590). The control circuit drives the gates of N1 (item 601) and N2 (item 602) and the bulk switches SW1 (item 203), SW2 (item 205), SW3 (item 204), and SW4 (item 206).

The operating table for this circuit using cascaded NMOS FET switches is shown as Table 1 below.

TABLE 1

Operating modes for Cascaded NMOS Circuit.

| Mode | N1 | BULK N1 | N2 | BULK N2 |
| --- | --- | --- | --- | --- |
| Charging *) | ON | SW2 ON | ON | SW4 ON |
| Over Charging | OFF | SW2 ON | OFF | SW4 ON |
| Charging in Over Discharged State | ON | SW2 ON | MOS DIODE | SW4 ON |
| Discharging *) | ON | SW1 ON | ON | SW3 ON |
| Over Discharging | ON | SW1 ON | OFF | SW3 ON |
| Discharging in Over Charged State | ON | SW1 ON | MOS DIODE | SW3 ON |

When the circuit is in the charging or discharging mode, both of the transistors N1 and N2 are ON. The bulk of N1 (item 201) is coupled to the MID node (item 550) by turning ON SW2 (item 205). The bulk of N2 (item 202) is coupled to the load terminal GNDOUT (item 590) by turning ON SW4 (item 205). If an over charging condition is detected, the control circuit turns OFF both switches N1 and N2 to interrupt current flow. The configuration of the bulks presents a series of reversed biased p-n junctions between the negative battery terminal GND (item 500) and the load terminal GNDOUT (item 590) to thereby block-charging current. The use of two NMOS devices allows the voltage difference between GND (item 500) and GNDOUT (item 590) to drop across two bulk-to-drain diodes and thereby increases the operating range when compared to a single-transistor approach. If an over discharge event is detected, the control circuit turns OFF N2 (item 202). In this case, however the bulk of N1 (item 201) is coupled to GND (item 500) by SW1 (item 203) and the bulk of N2 (item 202) is coupled to MID (item 550) by SW3 (item 204). This creates a series of reverse biased p-n diodes from the GNDOUT (item 590) to GND (item 500). Discharging current flow is thereby stopped by the channel of N2 (item 202) and the reverse-biased diodes. In the charging an over discharged battery case and in the discharging the over charged battery case, the cascaded circuit works as shown in Table 1. Note that the first transistor N1 (item 201) is held ON for both cases. However, the second transistor N2 (item 202) is biased to the MOS diode case to protect the battery. Additionally a resistive voltage divider $Z_1$ (item 220) and $Z_2$ (item 230) is added for the clamping of the MID potential via switch SW5 (item 210) in the cases, where both FETs N1 (item 201) and N2 (item 202) are OFF.

Such prior art circuits have several drawbacks. Li-Ion batteries for example, need an electronic protection to guarantee, that the battery cannot be overcharged or deep-discharged. Actual protection circuits contain a control circuit and external MOSFETs. In case of malfunction high positive or negative voltages will occur across the MOSFETs. These malfunctions also include the erroneous connection of the charger with wrong polarity, thus leading to an operation of the charger in reverse condition. Discrete MOSFETs are able to withstand voltages up to 30 V positive and negative, but with the drawback of a multiple component solution. The main disadvantages however with the use of discrete components are the increase of the manufacturing cost (higher assembly cost) and also its larger physical size (greater space requirements). A completely integrated version (MOSFETs integrated into the control circuit) is normally limited in its voltage range across the MOSFETs to +12 V (forward direction) and to –2 V (reverse direction) due to the breakthrough voltages of the MOS—devices. It is therefore a challenge for the designer of such circuits to achieve a high quality solution, especially with regard to the faulty case when trying to charge under reversed voltage conditions, i.e. voltages with wrong polarity, where the very low breakdown voltages of the MOS-devices in reverse direction are the limiting specifications.

There are several efforts and labors with various patents referring to such approaches.

U.S. Pat. No. 5,877,534 (to Williams, et al.) describes a method of forming an electrostatic discharge protection device for integrated circuits, where an electrostatic discharge (ESD) device includes a pair of depletion mode MOSFETs connected drain-to-drain in a series path between an input terminal and an output terminal, the gate of each MOSFET being connected to its source. A first diode having a relatively high breakdown voltage is connected between ground and the common drain terminal of the MOSFETs, and a second diode having a relatively low breakdown voltage is connected between ground and the output terminal of the device. The second diode breaks down during a relatively low, long-lived voltage spike (in an automobile, sometimes referred to as a "load dump"), while the second MOSFET saturates, limiting the size of the current through the second diode. The first diode breaks down during a large voltage spike of short duration, such as occurs from an ESD.

U.S. Pat. No. 5,939,908 (to Moore, et al.) discloses a dual FET driver circuit for supplying an electric current to a device having a pair of power FET's connected in series between the device and a power supply.

U.S. Pat. No. 6,154,081 (to Pakkala, et al.) shows a load circuit having extended reverse voltage protection, where an improved reverse voltage protection circuit that protects sensitive electronic devices from damage due to both reversed battery connections and source voltage interruptions. An N-channel protection FET is inversely connected between the negative terminal of the protected device and ground, and the conduction of the protection FET is extended during a reverse transient protection period following interruption of the source voltage. A capacitor connected across the gate-to-source circuit of the protection FET is charged from the source voltage through a low impedance charging circuit including a diode to prevent the capacitor from discharging, and is discharged during an interruption of the source voltage through a high impedance discharging circuit connected in parallel with the charging circuit.

SUMMARY OF THE INVENTION

A principal object of the present invention is to provide an effective and very producible circuit for controlling the charging and discharging of rechargeable batteries with sophisticated battery protecting capabilities.

A further important object of the present invention is to account for an erroneous operation of the protection switch, especially under charging conditions with reversed voltages, i.e. voltages with wrong polarity.

Another still further object of the present invention is to cascade switchable bulk FET devices to increase the voltage range of the circuit.

Yet another still further object of the present invention is to charge the middle node between cascaded FET devices to improve performance.

Another still further object of the present invention is to form the switchable bulk FET devices using either NMOS or PMOS devices.

Another further object of the present invention is to eliminate the necessity for an implementation with discrete MOSFET components.

Another still further object of the present invention is to reach a cost reduced method of manufacture.

A still further object of the present invention is to reduce the power consumption of the circuit.

Another object of this invention is its manufacturability as a monolithic semiconductor integrated circuit.

Also an object of the present invention is to reduce the cost of manufacturing by implementing the circuit as a monolithic integrated circuit in low cost CMOS technology.

Also another object of the present invention is to reduce cost by effectively minimizing the number of expensive components.

In accordance with the objects of this invention, a circuit is described, capable of safely charging rechargeable batteries, especially of the Li-Ion type with due respect for the tight operating specifications of these batteries in that case i.e. especially not to over charge or over heat the battery during charging.

Also in accordance with the objects of this invention, a circuit is described, capable of securely discharging batteries; especially of the Li-Ion type with due respect for the tight operating specifications of these batteries in that case i.e. not to deep discharge or over heat the battery during discharging.

Further in accordance with the objects of this invention, a circuit is given, capable of being safely operated under certain faulty operating conditions, i.e. for example, the battery charger coupled in reverse condition i.e. with wrong polarity.

Equally in accordance with the objects of this invention, a circuit is shown, implementing a protection switch circuit for batteries with enhanced reverse voltage protection, especially apt for being manufactured as a single monolithic integrated circuit in CMOS technology.

In accordance with the general objects of this invention a circuit for storing electrical energy, and consuming or supplying this energy with intrinsic protection features is presented. This circuit comprises means for the storage of electrical energy; means for, on the one hand, the consumption of electrical energy or means for, on the other hand, the supply of electrical energy; and means for the secure connection of said energy storage means with said energy consumption or supply means, whereby a switchable and controllable flow of energy between said energy storage means and said energy consumption or supply means is made possible in conjunction with protection against damaging or destructive operational conditions during said connection with said energy flowing, all this implemented by means of controllable switches within a switching circuit block— establishing said secure connection—and which in turn itself is controlled by a controller circuit block monitoring both said stored electrical energy and said consumed or supplied electrical energy.

Especially in accordance with the objects of this invention a circuit for battery charging and discharging with intrinsic protection features is explained. It contains a battery with two terminals, called the one and the other battery terminals, each being either of the positive or the negative terminal type; a load or charger two-pole device with two terminals each; a first FET switch having gate, source, drain, and a separate bulk, wherein said drain is coupled to one battery terminal; a second FET switch having gate, source, drain, and a separate bulk, wherein said drain is coupled to said first FET switch source to thereby form a mid node and wherein said source is coupled to a load or charger terminal; and means for controlling said first and second FET gates together with said separate bulks wherein the gate voltages of said first and second FET switches determine the OFF and ON states of said first and second FET switches, and wherein said first FET separate bulk is coupled switchable between said one battery terminal and said mid node, and wherein said second FET separate bulk is coupled switchable between said mid node and said load or charger terminal and wherein another additional controllable switch is connected between said other battery terminal and said mid node.

Further in accordance with the objects of this invention this circuit includes said means for controlling said first and second FET gates together with said separate bulks and therein especially comprises charge pump circuits for securely generating the ON state voltages for said separate switchable bulk coupling devices.

BRIEF DESCRIPTION OF THE DRAWINGS

In the accompanying drawings forming a material part of this description, the details of the invention are shown:

FIG. 3 is functionally corresponding to the circuit of FIG. 2 prior art.

DESCRIPTION OF THE PREFERRED EMBODIMENTS

The preferred embodiments disclose a novel optimized circuit for a protection switch with enhanced reverse voltage protection for effectively protecting a battery during charging and discharging operations and implementable as integrated circuit not needing any other essential external semiconductor components and normally used in portable electronic systems equipped with rechargeable batteries. The circuit uses MOSFET devices having switchable bulk connections to achieve control of both charging and discharging currents. These FET devices are cascaded to increase the operating range of the circuit. This provision is especially effective for the faulty case, when trying to charge under reversed voltage conditions, i.e. the charger connected with wrong polarity, where the very low breakdown voltages of the MOS-devices in reverse direction are the limiting specifications. To allow the fabrication of the whole protection circuit as one chip MOSFETs and control functions have to be integrated on one silicon die. It should be clear to those experienced in the art that the present invention can be applied and extended without deviating from the scope of the present invention.

A preferred embodiment of the invention is described now by explaining the circuit and its essential features of operation.

Figures 3, 4:
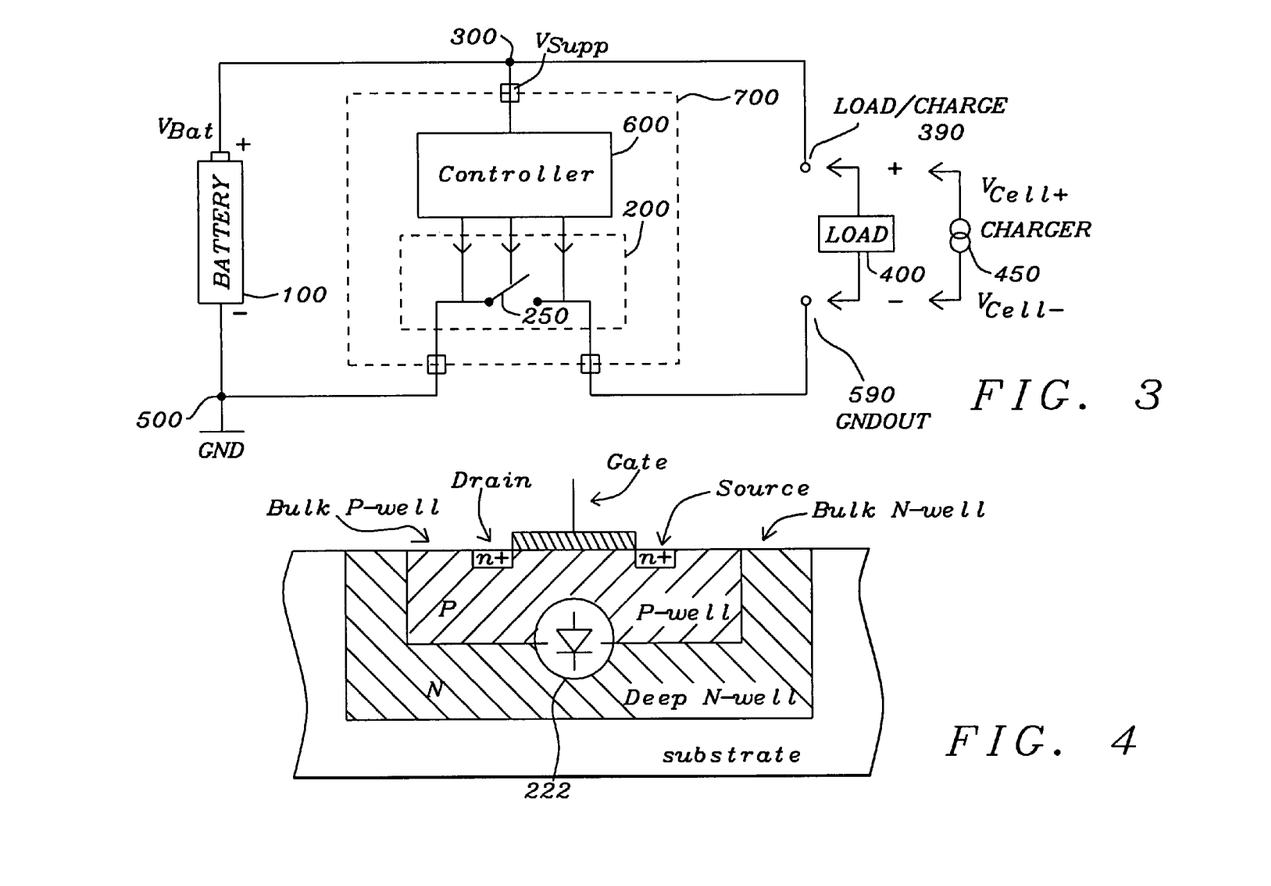
FIG. 3 presents the electrical circuit schematics for the realization of the protection circuit of the invention in form of a block diagram, wherein the controller and the protection-switching block are now integrated parts of a single monolithic circuit.
FIG. 4 shows the cross-section of a single NMOS FET switching device for the specific preferred realization with integrated circuit technology of the present invention with the P-well bulk, which can be independently biased and the parasitic diode, formed between the P-well bulk and surrounding deep N-well regions.

Referring now to FIG. 3, a description of the protection circuit according to the invention is given. A rechargeable battery (item 100) is connected with its negative pole to ground GND (item 500) and its positive pole to the supply line (item 300) with their LOAD/CHARGE terminals (item 390), whereto either the LOAD device (item 400) is connected—in the case of normal supply operation for the system i.e. discharging the battery, or alternatively the CHARGER device (item 450) is connected—in the case of recharging the battery. The positive and negative voltage pins of the charger are designated with their voltages $V_{Cell+}$ and $V_{Cell-}$ respectively, whereby when connected to the circuit the voltage $V_{Cell+}$ takes on the value of $V_{Bat}$. These two latter devices, the LOAD device and the CHARGER device are as so-called two-pole devices connected with their other pole respectively to terminal GNDOUT (item 590), which is linked via the controllable switch (item 250) inside of the switching block (item 200) back again to terminal GND (item 500). Thus the circuit for the supply current is closed. The switching block (item 200) is controlled by a controller block (item 600), containing all the necessary logic and circuitry for the operations required by the whole protection circuit. This controller block is necessarily wired also to the supply line (item 300). The merger of this controller block (item 600) and the aforementioned switching block (item 200) into a single integrated circuit (IC) as achieved for this invention is called the protection switch IC (item 700). To integrate the whole protection circuit in one chip MOSFETs and control functions have to be integrated on one silicon die. This has an influence on the reverse protection capability of the protection switches since the voltage capabilities of integrated MOSFETs in a CMOS process are much lower than that of discrete components. As a solution for this problem a circuit was developed that uses cascading of MOSFET devices in the forward and backward direction for the switch (item 250) in the switching block (item 200) to achieve the protection levels required. The basic idea of the concept is to distribute the externally applied voltage equally across two separate MOSFET devices. This roughly doubles the voltage capabilities of the protection circuit.

Referring now to FIG. 4, a cross-section through a MOSFET switching transistor realized in CMOS technology with P-well and deep N-well bulk is shown, as arising from the manufacture of the switching FETs in a monolithic integrated circuit implementation. The fabrication of the NMOS FET switches in a well (p-type) is a necessary and particularly important feature for this application, because this well can be isolated from the semiconductor substrate. In this way, the well, or bulk of the device can be biased independently of the substrate. As result from this structure, a parasitic P-well deep N-well diode is created and explicitly shown as symbol, item 222. Its influence has to be taken into due account for the dimensioning of the circuit. The deep N-well region is connected to the supply voltage $V_{Supp}$ of the protection switch IC (item 700 in FIG. 3) chip. As the pin for this voltage is normally connected to the positive pole of the battery, the supply voltage $V_{Supp}$ and the battery voltage $V_{Bat}$ are essentially the same, which can be clearly seen from FIG. 3.

Figure 5:
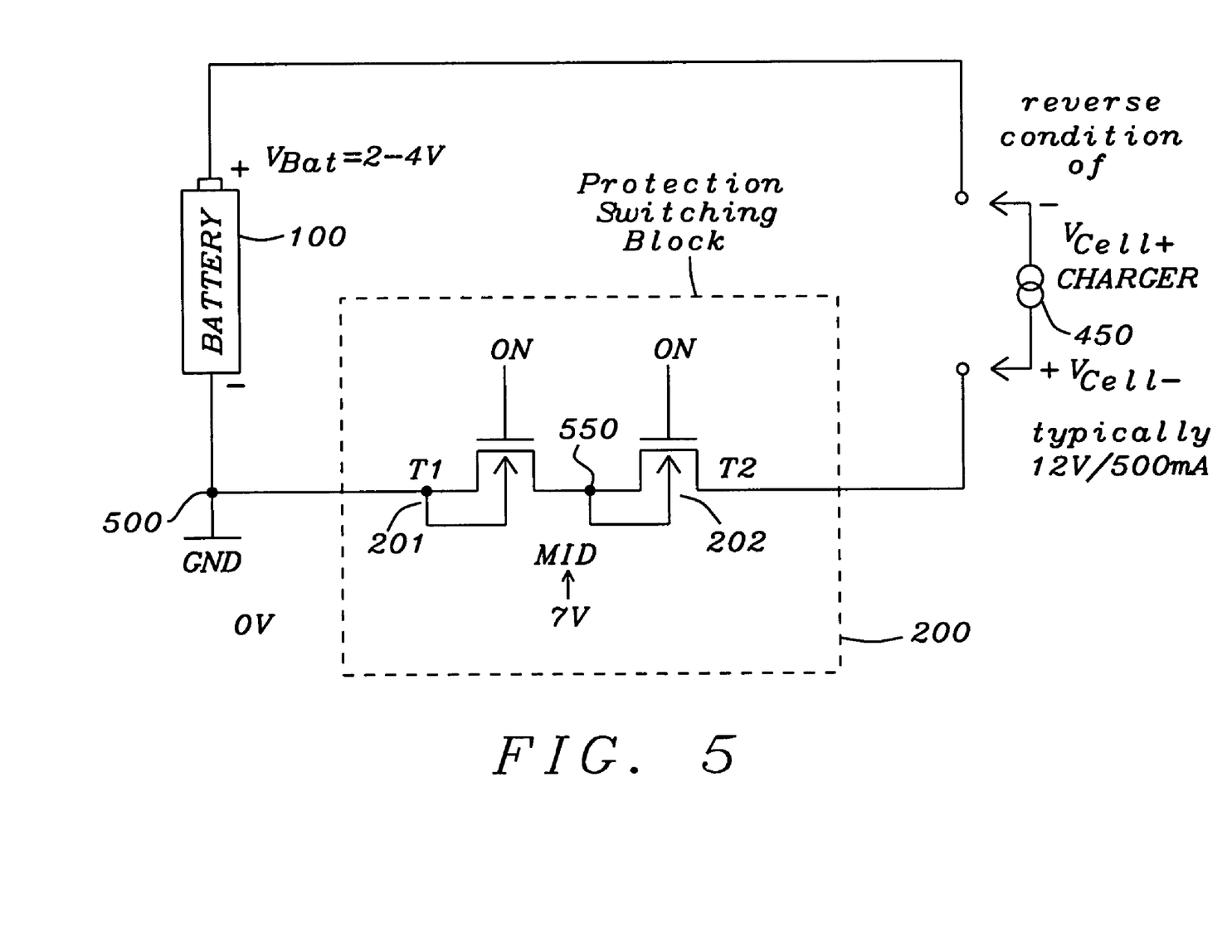
FIG. 5 illustrates the functional circuit schematic used for the preferred realization of the present invention with the essential components of the protection switching block shown in discharging operation mode, whilst the charger is erroneously connected with the wrong polarity, i.e. in reverse condition. The operating mode "discharging" has to be chosen here, because the reversed charger (item 450) looks to the circuit like a heavy load, thus discharging the battery (item 100). This means in other words, that the reverse condition only occurs whilst operating in discharging mode.

Regarding now FIG. 5, a simplified circuit diagram is shown for the preferred implementation of the present invention, and reduced to the essential components used for the realization of the protection switch; implemented as MOSFET cascade for the switching transistors and shown in discharging operation mode (according to Table 2), with the charger here spuriously operating in reverse condition. Typical values for the battery voltages (Li-ion) are 2–4 V as indicated, whereby the charger is capable to furnish a voltage of 12 V and to deliver a current of 500 mA. If the voltage at the middle node MID (item 550) would be allowed to rise to 7V (as indicated in FIG. 5) the parasitic P-well to deep N-well diode of transistor T2 (item 202) would become forward biased because the deep N-well region is hooked up to the battery voltage $V_{Bat}$, which is e.g. here at 4.3 V maximum. This must be avoided in any case by limiting the voltage at the mid node MID to a value of $V_{Bat}$.

Figures 6, 7A:
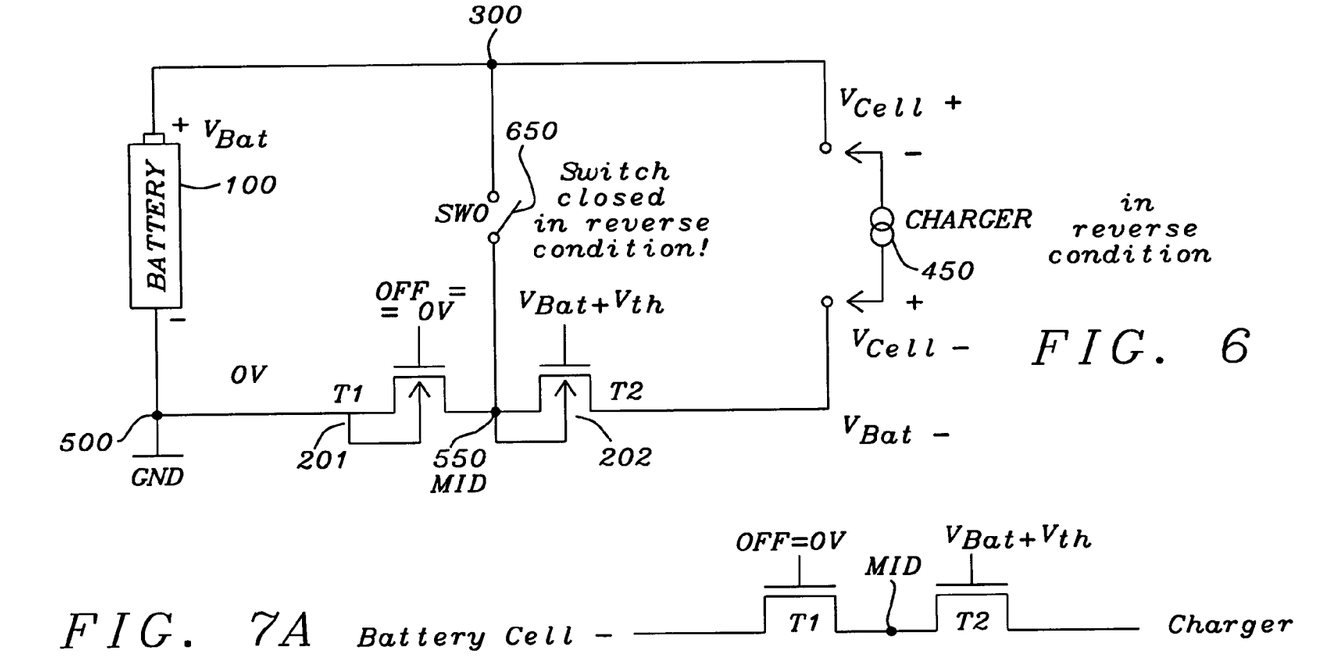
FIG. 6 shows the simplified electrical circuit schematics of the switching stage in the preferred embodiment of the present invention, where the circuit (herein equipped with NMOS transistors) is operating in discharging mode because of the charger connected in reverse condition; the additional controller switch is closed and transistor T2 (here designated as N2, as used for the implementation with NMOS transistors) is operating as source follower.
FIG. 7A and FIG. 7B depict the specific voltage relations within the circuit of the invention at the MOSFET cascade transistors with the charger connected in reverse condition.

Regarding now FIG. 6, illustrating as simplified circuit diagram the assembly from FIG. 5 upgraded with an additional switch SW0 (item 650), connecting the $V_{Bat}$ supply line (item 300) to the mid point MID (item 550) between MOSFET T1 (item 201) and MOSFET T2 (item 202), when operating with charger in reverse condition. Under this condition MOSFET T2 works as a source follower and limits the voltage at the mid point MID to $V_{Bat}$. This means, that the parasitic P-well deep N-well diode (item 222 in FIG. 4) of transistor T2 is not being operated in a problematic manner.

FIG. 7A shows the switch part of the circuit with the cascade of MOSFETs T1 and T2. In the reverse condition the switch is in the state sketched. The transistor T1 on the left, which is connected to the negative terminal of the battery cell, is switched off. The other transistor T2 works as a source follower with a voltage of $V_{Bat}+V_{th}$ applied to its gate. $V_{Bat}$ is the battery voltage and $V_{th}$ is the threshold voltage of an NMOS transistor. This implies that the voltage potential of the mid point MID between T1 and T2 cannot rise higher than $V_{Bat}$. This is important, since the bulk of T2 is connected to this mid point MID and therefore the potential of this point is not allowed to go beyond $V_{Bat}$, since this would otherwise forward bias the bulk to deep N-well diode of T2. This means, that the maximum allowable voltage applied to the charger pin is $V_{Bat}$ plus the breakthrough voltage capability $V_{th}$ of the transistor T2.

Figure 7B:
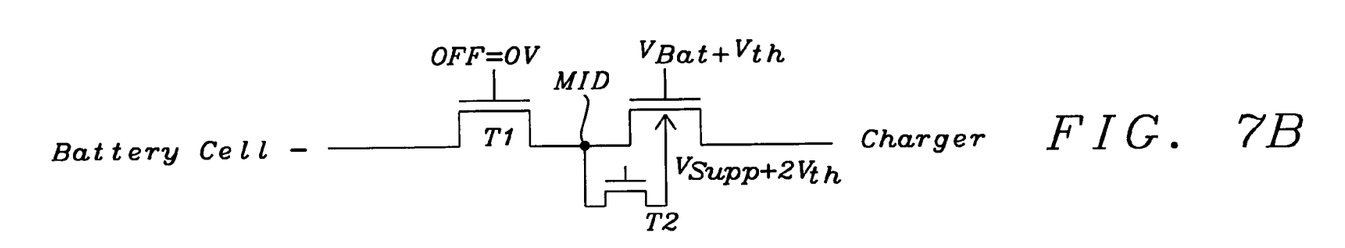

FIG. 7B shows the switching part of the circuit for the explanation of another feature during a charger operation in reverse condition. It is a problem in reverse condition, how to properly connect the bulk of T2 to the mid point MID. The problem consists in the difficulty to switch on the bulk switch, because its bulk is already at supply voltage level ($V_{Supp}=V_{Bat}$). This can only be resolved in the case of an NMOS transistor with a dimensioning, where the gate is biased about two threshold voltages ($2 \times V_{th}$) higher than the supply voltage $V_{Bat}$. This voltage, which is higher than the supply voltage, namely $V_{Bat}+2*V_{th}$ has to be applied to its gate and therefore an additonal charge pump is needed.

Figure 8:
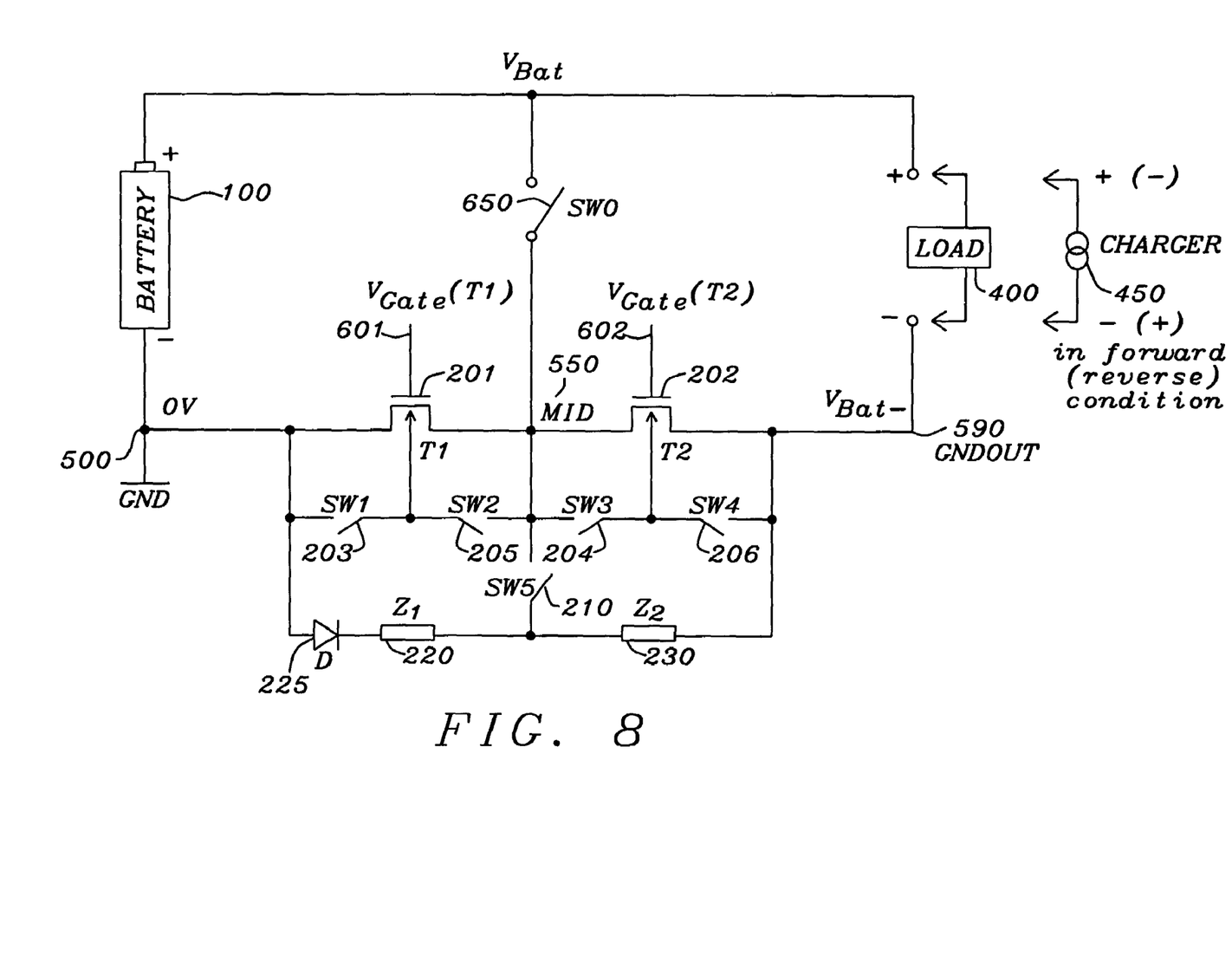
FIG. 8 shows the circuit diagram of the new and enhanced protection circuit according to the invention.

FIG. 8 now represents a preferred embodiment of the invention of the enhanced protective circuit with the additional added switch as shown, capable to fully cope with the case, where the charger is being operated in reverse condition, i.e. a charger connected to the device with wrong, inverse polarity. In this circuit again two FET switches T1 (item 201) and T2 (item 202) are used, both connected together at a common node, called mid-point MID (item 550). The transistors T1 and T2 are cascaded to provide a combined switch having a larger operating voltage range than that, being available with a single switch. This is a configuration as already developed for the related patent "Power Switch for Battery Protection". It is however essentially enhanced by two additional components, a switch SW0 (item 650) and a diode (item 225). The switch SW0 is introduced as a first enhancement to guarantee the setting of the correct MID potential in the reverse condition case, as already described with FIG. 7A. Establishing this MID potential in those cases, where both FETs T1 (item 201) and T2 (item 202) are OFF and the resistive voltage divider $Z_1$ (item 220) and $Z_2$ (item 230) is needed for the clamping of this MID potential via this diode (item 225), now the second enhancement by this additional diode comes into play. Evidently in these cases switch SW5 has to be closed. All the other switches (SW1 to SW4) are used as bulk switches and all these switches on their part are implemented as MOSFET devices. Thus the voltage range of the switches is limited by the drain-to-bulk reverse breakdown as given be the manufacturing process. This breakdown voltage may be about 7 Volts for a single FET, for example. This means that the charger design must be limited to not generate a voltage greater than the battery voltage plus the breakdown voltages of the FETs. The use of the cascaded FET devices T1 (item 201) and T2 (item 202) increases the operating range of the combined switch in such a way, that a voltage difference of, for example, about 14 Volts can be sustained in the OFF state. The first FET switch T1 has gate, source, drain, and bulk. The drain is coupled to the negative battery terminal, GND (item 500). The bulk is switchable coupled between the negative battery terminal GND and a middle node MID (item 550) between the cascaded FET devices T1 (item 201) and T2 (item 202). The second FET switch T2 (item 202) also has gate, source, drain, and bulk. The drain is coupled to the first FET switch T1 source at the mid node MID (item 550). The source is coupled to the load terminal node GNDOUT (item 590). The bulk of T2 (item 202) is switchable coupled between MID (item 550) and the load terminal GNDOUT (item 590). The control circuit drives the gates of T1 (item 601) and T2 (item 602) and the bulk switches SW1 (item 203), SW2 (item 205), SW3 (item 204), and SW4 (item 206). The newly introduced switch SW0 (item 650), connecting the mid-point MID (item 550) to the positive battery and load or charger voltage terminal with voltage $V_{Bat}$ is needed for the additionally considered case of operation with "Inversed Voltage Charger (reverse condition)" as itemized as an additional state in the operating table for this circuit using cascaded NMOS FET switches and shown as Table 2 below. The behaviour of the switches in the other states is already described in principle in the related patent application "Power Switch for Battery Protection"; see description for FIG. 2 prior art with its Table 1; for the new circuit of the invention according to FIG. 8 however, a modified and extended description is necessary and given with Table 2 as shown below, describing the modified steering of the bulk switches and the additionally and extended operating mode for the case with an inversed voltage charger i.e. the operation in reverse condition. The table is set-up for an implementation essentially with N-MOS transistors, therefore transistor T1 is named $N_1$, and transistor T2 respectively is named N2. For the understanding of the table it is helpful to know, that only the currently closed switches are cited as ON, the other respective switches are always open i.e. OFF.

TABLE 2

Operating modes for Cascaded NMOS Circuit with Reverse Protection

| Mode | N1 | BULK N1 | N2 | BULK N2 |
|---|---|---|---|---|
| Charging | ON | SW2 ON | ON | SW4 ON |
| Over Charging **) | OFF | SW2 ON | OFF | SW4 ON |
| Charging in Over Discharged State | MOS DIODE | SW2 ON | ON | SW4 ON |
| Discharging | ON | SW1 ON | ON | SW3 ON |
| Over Discharging ***) | OFF | SW1 ON | ON | SW3 ON |
| Discharging in Over Charged State | ON | SW1 ON | MOS DIODE | SW3 ON |
| Inversed Voltage Charger (reverse condition) ****) | OFF | SW1 ON | ON (Source follower) | SW3 ON |

Figure 9A:
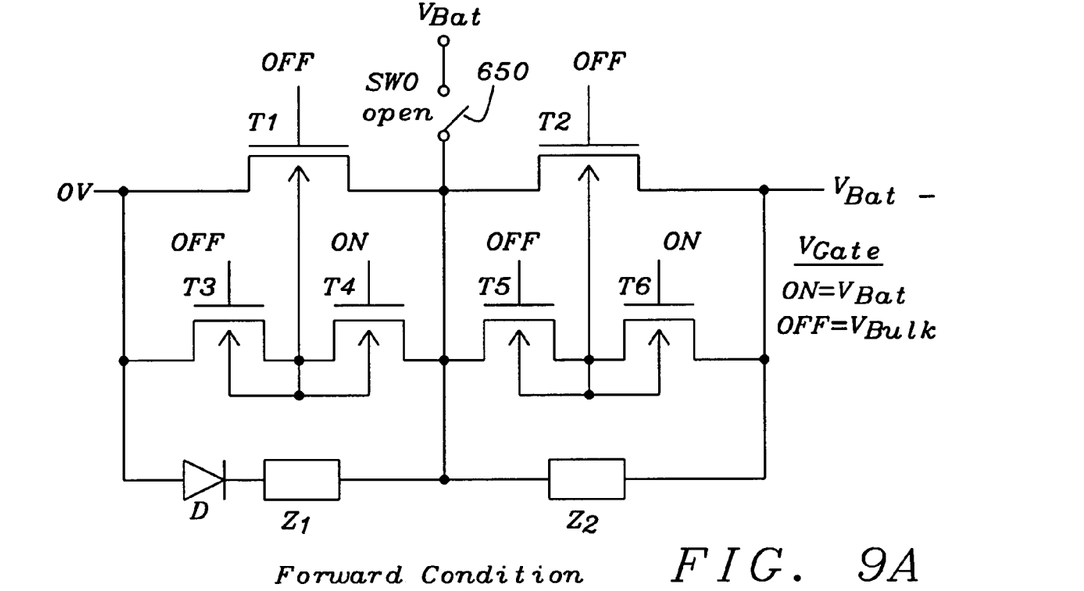
FIG. 9A and FIG. 9B depict the detailed relations for the circuit of the invention within the switching block occurring whilst the charger is operating in reverse and forward conditions.

In FIG. 9A the operational conditions during charging operation in "Over Charging" mode (according to Table 2: )) for the MOSFETs of the switching block T1 and T2 together with the MOSFETs T3, T4 and T5, T6 for the switching of the bulks respectively are shown in every detail. The new switch SW0 (item 650) is open. The charger is properly connected and thus being operated in forward condition, i.e. the normal case for the switching MOSFETs. This state is chosen here as one of the two possible "switched off" charging states, the other "switched off" charging state is described with FIG. 9B. A third "switched off" state occurs during discharging (according to Table 2: *)), which however has already formerly been considered in the related patent application "Power Switch for Battery Protection". Only in the "switched off" charging states these high voltages may occur, which the chip has to withstand under worst conditions, therefore leading to the application of the cascading transistors principle and used in one (forward condition) or the other (reverse condition) direction.

Figure 9B:
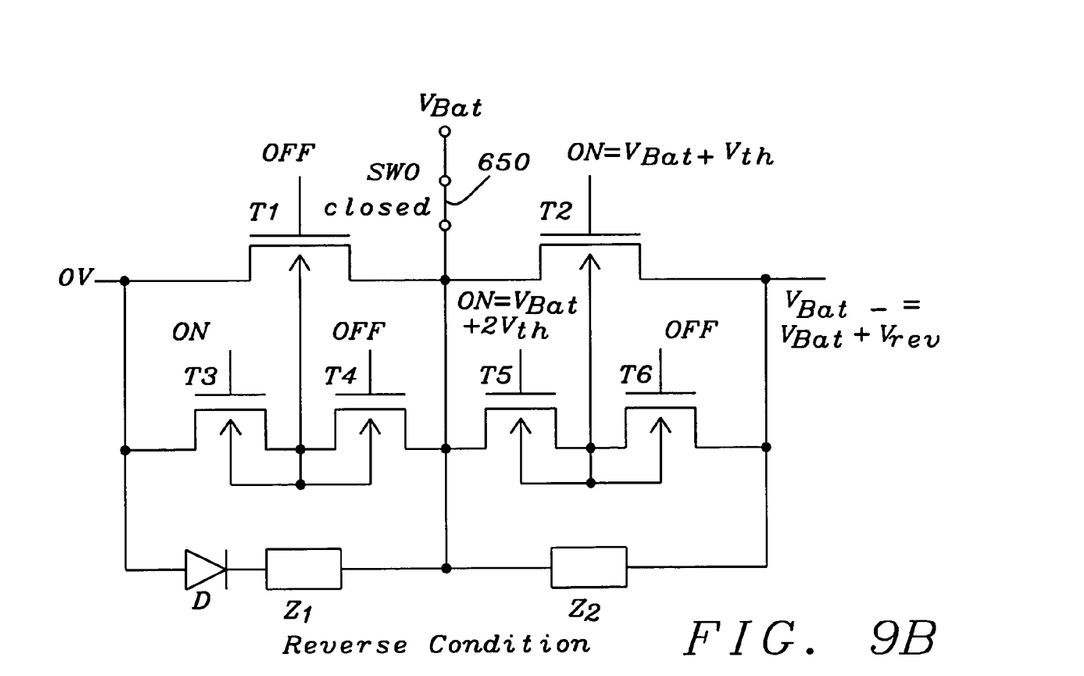

In FIG. 9B the operational conditions in "Inversed Voltage Charger (reverse condition)" mode (according to Table 2: ****)) for the MOSFETs of the switching block T1 and T2 together with the MOSFETs T3, T4 and T5, T6 for the switching of the bulks respectively are shown in every detail. The charger is inversely connected and thus being operated in reverse condition, i.e. signifying the problematic case for the switching MOSFETs. Only for this case the new switch SW0 (item 650) is now closed. As already shown with the explanations for FIG. 7A and FIG. 7B, FET T2 is working as a source follower in this case and turned on with a gate voltage of $V_{Bat}+V_{th}$. To turn on FET T5 one needs to supply a voltage of at least $V_{Bat}+V_{th}$ to the gate of T5, better even a higher voltage, such as $V_{Bat}+2*V_{th}$. The generation of these turn-on voltages, i.e. the voltage $V_{Bat}+V_{th}$ at the gate of T2 and $V_{Bat}+2*V_{th}$ at the gate of T5 is made with the help of two floating charge pumps.

Figure 10:
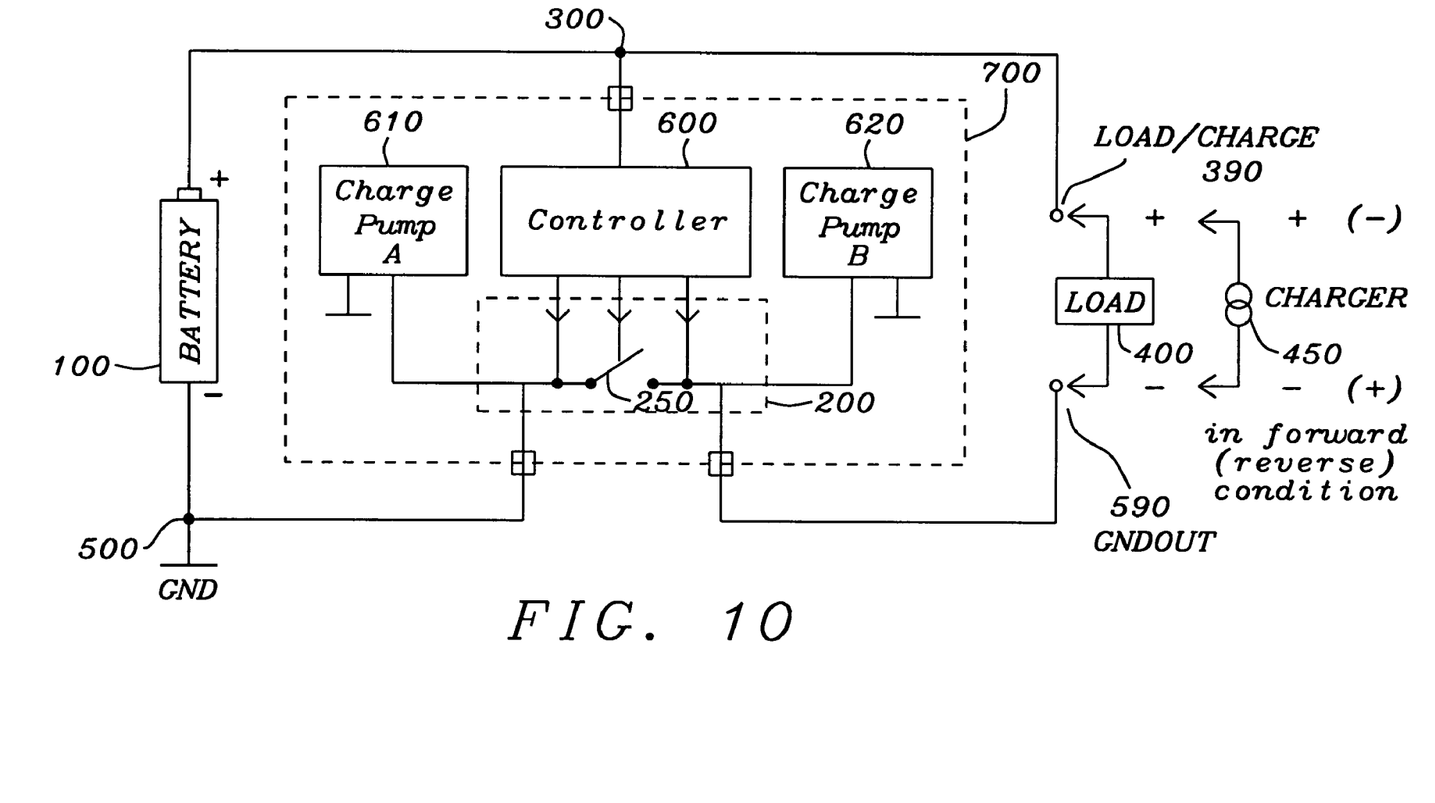
FIG. 10 illustrates in form of a block diagram the charge pump enhanced internal structure of the preferred embodiment of the circuit of the invention.

Regarding now FIG. 10, illustrating the complete assembly for the novel protection switch with reverse voltage protection a block diagram is showing mainly the components from FIG. 3 plus two additional charge pumps. A rechargeable battery (item 100) is connected with its negative pole to ground GND (item 500) and its positive pole to the supply line (item 300) with their LOAD/CHARGE terminal (item 390), whereto either the LOAD device (item 400) is connected—in the case of normal supply operation for the system i.e. discharging the battery, or alternatively the CHARGER device (item 450) is connected—in the case of recharging the battery. These two latter devices are—as so-called two-pole devices—connected with their other pole respectively to terminal GNDOUT (item 590), which is linked via the controllable switch (item 250) inside of the switching block (item 200) back again to terminal GND (item 500). Thus the circuit for the supply current is closed. The switching block (item 200) is controlled by a controller block (item 600), containing all the necessary logic and circuitry for the operations required by the whole protection circuit. This controller block is necessarily wired also to the supply line with voltage $V_{Bat}$ (item 300), whereby in case of the operation in reverse condition for the charger, an internal switch to this line is closed, in order to clamp the mid-potential of the switching block (item 200) to $V_{Bat}$. Additionally two floating charge pumps are appropriately introduced in order to generate the needed turn-on voltages for the MOSFETs T2 and T5 as shown in FIG. 9B. Charge pump A (item 610), generating the turn-on gate voltage $V_{Bat}+V_{th}$ for MOSFET T2 and charge pump B (item 620) for generating the turn-on gate voltage $V_{Bat}+2*V_{th}$ for MOSFET T5. The merger of the controller block (item 600) and these two charge pumps (items 610 and 620) together with the switching block (item 200) into one single integrated circuit (IC) as achieved for this invention is called the protection switch IC (item 700). It shall be pointed out, that both charge pumps, A and B (items 610 and 620) are working with GND potential (item 500) as their negative supply voltage.

It should also be noted that the implementation of this concept is not necessarily bound to the use of NMOS devices, it may also be implemented with PMOS devices. This has already been described in great detail in the related patent application "Power Switch for Battery Protection".

As shown in the preferred embodiments, this novel circuit provides an effective and manufacturable alternative to the prior art.

While the invention has been particularly shown and described with reference to the preferred embodiments thereof, it will be understood by those skilled in the art that various changes in form and details may be made without departing from the spirit and scope of the invention.

The invention claimed is:

1. A circuit for storing electrical energy, and consuming or supplying this energy with intrinsic protection features, comprising:
   a means for the storage of electrical energy;
   a means for, on the one hand, the consumption of electrical energy or
   a means for, on the other hand, the supply of electrical energy; and
   a means manufactured as integrated circuit for secure connection of said energy storage means with said energy consumption or supply means, whereby a switchable and controllable flow of energy between said energy storage means and said energy consumption or supply means is made possible in conjunction with protection against damaging or destructive operational conditions during said connection with said energy flowing, and where the flow of energy is controlled by means of integrated controllable switches contained within an integrated switching circuit block—establishing said secure connection—and said integrated switching circuit block being controlled by an integrated controller circuit block sensing and monitoring both said stored electrical energy and said consumed or supplied electrical energy and generating and delivering control signals for said integrated switching circuit block.

2. The circuit according to claim 1 wherein said integrated controllable switches are implemented using Field Effect Transistors (FETs).

3. The circuit according to claim 2 wherein said integrated controllable switches are implemented using FETs of the NMOS type with separate bulk connections.

4. The circuit according to claim 2 wherein said integrated controllable switches are implemented using FETs of the PMOS type with separate bulk connections.

5. The circuit according to claim 1 wherein said means of integrated controllable switches within an integrated switching circuit block is realized with two FETs, serially connected in a cascade circuit between said energy storage means and said energy consumption or supply means, thus forming a mid node between said two serially connected FETs.

6. The circuit according to claim 5 wherein said mid node is connected via an additional integrated controllable switch to the integrated controller circuit block monitoring both said stored electrical energy and said consumed or supplied electrical energy.

7. The circuit according to claim 6 wherein said additional controllable integrated switch is implemented as FET.

8. The circuit according to claim 6 wherein said additional integrated controllable switch is closed and wherein one of said two FETs, which are serially connected in a cascade circuit, is operated as a source follower.

9. The circuit according to claim I wherein said means for the storage of electrical energy is a battery.

10. The circuit according to claim 1 wherein said means manufactured as integrated circuit (IC) for secure connection of said energy storage means with said energy consumption or supply means is implemented as a monolithic IC device.

11. The circuit according to claim 10 wherein said IC device is realized in CMOS technology.

12. The circuit according to claim 10 wherein said IC device is realized in CMOS deep well technology.

13. A circuit for battery charging and discharging with intrinsic protection features, comprising:
   a battery with two terminals, called the one and the other battery terminals, each being either of the positive or the negative terminal type;
   a load or charger two-pole device with two terminals each;
   a first FET switch having gate, source, drain, and a separate bulk, wherein said drain is coupled to one battery terminal;
   a second FET switch having gate, source, drain, and a separate bulk, wherein said drain is coupled to said first FET switch source to thereby form a mid node and wherein said source is coupled to a load or charger terminal; and
   a means for controlling said first and second FET gates together with said separate bulks wherein the gate voltages of said first and second FET switches determine the OFF and ON states of said first and second FET switches, and wherein said first FET separate bulk is switchable coupled between said one battery terminal and said mid node, and wherein said second FET separate bulk is switchable coupled between said mid node and said load or charger terminal and wherein another additional controllable switch is connected between said other battery terminal and said mid node.

14. The circuit according to claim 13 wherein said first and said second FET switches comprise NMOS FET devices connected between said one battery terminal—which is of the negative battery terminal type—and the load or charger terminal, whereas the other battery terminal is of the positive terminal type.

15. The circuit according to claim 13 wherein said first and said second FET switches comprise PMOS FET devices connected between said one battery terminal—which is of the positive battery terminal type—and the load or charger terminal, whereas the other battery terminal is of the negative terminal type.

16. The circuit according to claim 13 wherein said means of controlling said first and said second FET gates together with said separate bulks further comprises charge pump circuits for securely generating the ON state voltages for said cascaded FET switches and for said separate switchable bulk coupling devices.

17. The circuit according to claim 13 wherein said FET switches and said means of controlling comprise a single monolithic integrated circuit (IC) device.

18. The circuit according to claim 17 wherein said IC device is manufactured in CMOS technology.

19. The circuit according to claim 17 wherein said IC device is manufactured in CMOS deep well technology.

20. The circuit according to claim 13 wherein said first FET switch separate bulk is coupled to said mid node and said second FET switch separate bulk is coupled to said load or charger terminal and wherein said other additional controllable switch connected between said other battery terminal and said mid node is open during battery charging.

21. The circuit according to claim 20 wherein said first FET switch and said second FET switch are turned to said ON state during normal charging.

22. The circuit according to claim 20 wherein said first FET switch and said second FET switch are turned to said OFF state during over charging.

23. The circuit according to claim 20 wherein said first FET switch acts as a MOS diode and said second FET switch is turned to said ON state during charging in a battery over discharged state.

24. The circuit according to claim 13 wherein said first FET switch separate bulk is coupled to said one battery terminal and said second FET switch separate bulk is coupled to said mid node during battery discharging.

25. The circuit according to claim 24 wherein said first FET switch and said second FET switch are turned to said ON state during normal discharging.

26. The circuit according to claim 24 wherein said first FET switch is turned to said OFF state and said second FET switch is turned to said ON state during over discharging.

27. The circuit according to claim 24 wherein said first FET switch is turned to said ON state and said second FET switch acts as a MOS diode during discharging in a battery over charged state.

28. The circuit according to claim 24 wherein said first FET switch is turned to said OFF state and said second FET switch is turned to said ON state acting as a source follower and wherein said other additional controllable switch connected between said other battery terminal and said mid node is closed during strongly discharging in an inverted voltage charger state (i.e. operating in reverse condition).

29. The circuit according to claim 13 further comprising:
  a voltage divider having an output setting up a voltage value between said one battery terminal voltage and said load or charger terminal voltage; and
  a means of coupling said voltage divider output and said mid node.

30. The circuit according to claim 29 wherein said means of coupling comprises a FET switch device.

31. The circuit according to claim 30 wherein said FET switch device is turned to the ON state in the case of over charging, i.e. when the first FET switch and the second FET switch are both turned OFF during over charging.

32. The circuit according to claim 29 wherein said voltage divider is connected via an additional diode device to said one battery terminal.

33. The circuit according to claim 29 wherein said FET switches and said means of controlling comprise a single monolithic integrated circuit (IC) device.

34. The circuit according to claim 33 wherein said IC device is manufactured in CMOS technology.

35. The circuit according to claim 33 wherein said IC device is manufactured in CMOS deep well technology.

* * * * *